(12) United States Patent
Suzuki et al.

(10) Patent No.: US 11,531,060 B2
(45) Date of Patent: Dec. 20, 2022

(54) CYLINDRICAL MEMBER, CONTACT PROBE AND SEMICONDUCTOR INSPECTION SOCKET

(71) Applicant: Yamaichi Electronics Co., Ltd., Tokyo (JP)

(72) Inventors: Takeyuki Suzuki, Tokyo (JP); Katsumi Suzuki, Tokyo (JP); Satoshi Iizumi, Tokyo (JP)

(73) Assignee: Yamaichi Electronics, Co. Ltd., Tokyo (JP)

( * ) Notice: Subject to any disclaimer, the term of this patent is extended or adjusted under 35 U.S.C. 154(b) by 242 days.

(21) Appl. No.: 16/896,924

(22) Filed: Jun. 9, 2020

(65) Prior Publication Data

US 2020/0393507 A1    Dec. 17, 2020

(30) Foreign Application Priority Data

Jun. 11, 2019 (JP) .............................. JP2019-108493
Apr. 10, 2020 (JP) .............................. JP2020-070980

(51) Int. Cl.
*G01R 31/26* (2020.01)
*G01R 31/28* (2006.01)
*G01R 1/067* (2006.01)
*G01R 1/073* (2006.01)

(52) U.S. Cl.
CPC ................. *G01R 31/2886* (2013.01)

(58) Field of Classification Search
CPC .......... G01R 31/28; G01R 1/04; G01R 1/067; G01R 1/073; G01R 31/26
See application file for complete search history.

(56) References Cited

U.S. PATENT DOCUMENTS

2017/0160311 A1\*  6/2017  Unokuchi .............. G01R 1/067
2018/0340976 A1\*  11/2018  Ishii .................... G01R 1/06722

FOREIGN PATENT DOCUMENTS

| JP | 2005-077772 U | 10/1993 |
| JP | 2005-009927 A | 1/2005 |
| JP | 2010-060316 A | 3/2010 |
| JP | 2011-117882 A | 6/2011 |
| JP | 2013-120065 A | 6/2013 |
| JP | 2013-134181 A | 7/2013 |
| JP | 2016-217910 A | 12/2016 |

\* cited by examiner

*Primary Examiner* — Neel D Shah (74) *Attorney, Agent, or Firm* — Hamilton, Brook, Smith & Reynolds, P.C.

(57) ABSTRACT

The cylindrical member includes a cylindrical base material 40 made of beryllium copper, a first coating layer that is formed on the base material 40 and made of a Ni-based material and serves as a reinforcing material for the base material 40, and a second coating layer 42 that is formed on the first coating layers and made of a metal-based material different from the base material 40, wherein the first coating layer 41 has higher hardness than the base material 40, when the thickness of the base material 40 is represented by $T_B$ and the layer thickness of the first coating layer 41 formed on the outer surface is represented by $T1_{OUT}$, the base material 40 is formed so as to satisfy 13 μm≤$T_B$≤25 μm, and the first coating layer 41 is formed so as to satisfy $T1_{OUT}≥T_B×4\%$.

8 Claims, 12 Drawing Sheets

| | COMPARATIVE EXAMPLE 1 | EXAMPLE 1 | EXAMPLE 2 | EXAMPLE 3 | COMPARATIVE EXAMPLE 2 |
|---|---|---|---|---|---|
| THICKNESS OF BASE MATERIAL TB[μm] | 7.5 | 15 | 18 | 25 | 37 |
| THICKNESS OF FIRST COATING LAYER ON OUTER PERIPHERAL SIDE T1OUT[μm] | NO | 0.6 | 0.8 | 1.0 | 12 |
| THICKNESS OF SECOND COATING LAYER ON INNER PERIPHERAL SIDE T2IN[μm] | NO | 0.25 | 0.3 | 0.5 | 0.6 |
| FORCE FOR PRESSING TEST PIECE[N] | 1.5 | 3.5 | 4.0 | 5.0< | 5.0< |
| TEST RESULT (CHECK OF COLLAPSE BY APPEARANCE INSPECTION) | FAIL | PASS | GOOD | GOOD | GOOD |
| METHOD OF PROCESSING BASE MATERIAL | ELECTRO-FORMING | PRESS | PRESS | PRESS | PRESS |
| COMPREHENSIVE EVALUATION | FAIL | PASS | GOOD | GOOD | FAIL |

CYLINDRICAL MEMBER, CONTACT PROBE AND SEMICONDUCTOR INSPECTION SOCKET

RELATED APPLICATIONS

This application claims priority under 35 U.S.C. § 119 or 365 to Japanese, Application No. 2019-108493, filed Jun. 11, 2019 and Japanese Application No. 2020-070980, filed Apr. 10, 2020. The entire teachings of the above applications are incorporated herein by reference.

TECHNICAL FIELD

The present invention relates to a cylindrical member, a contact probe, and a semiconductor inspection socket.

BACKGROUND ART

For electronic components such as IC packages to be mounted in electronic equipment or the like, a test for removing potential defects of the electronic components is generally performed by using an inspection socket in a stage before the electronic components are mounted on wiring boards. The inspection socket includes a contactor (contact probe) that electrically connects an electrode portion such as a solder ball or a solder bump of an electronic component and a printed wiring board (board) to be used as a test board or a mounting board.

A so-called spring probe has been widely adopted as the contact probe. The spring probe is configured so that a coil spring is accommodated in a cylindrical member (barrel) formed in a cylindrical shape and plungers provided at both ends of the barrel are moved. As described in Patent Literature 1, a method of growing a Ni layer by electroforming is known as an exemplary method of manufacturing a barrel. In addition, there are a method of cutting a copper-based material and a method of drawing a copper-based material.

Such a barrel plays a role of ensuring the strength for holding an assembly of a spring probe and also ensuring the conductivity for supplying an inspection signal and electric power.

CITATION LIST

Patent Literature

[PTL 1]
Japanese Unexamined Patent Application, Publication No. 2011-117882

SUMMARY OF INVENTION

Technical Problem

However, in recent years, electronic components have tended to be miniaturized, and accordingly, there have been demands for narrowing the pitch of contact probes and reducing the outer diameter of the barrel. However, since a space for accommodating a coil spring and the like inside the barrel must be secured, it is necessary to reduce the outer diameter of the barrel and simultaneously thin the body of the barrel. The thinning of the barrel body as described above causes reduction in the strength of the barrel and deterioration in conductivity.

At this time, for example, when a barrel is formed by growing Ni using electroforming as disclosed in Patent Literature 1, the reduction in strength caused by the thinning of the barrel body can be suppressed, but the conductivity may deteriorate. Moreover, in the method of cutting a copper-based material, it is difficult to form a thin barrel as required for narrowing the pitch, and further thickness deviation is likely to occur. Further, even in the method of drawing a copper-based material, it is difficult to form a thin barrel as required for narrowing the pitch, and further uniformity of plating applied to an inner surface is poor and it is difficult to thicken the plating. Still further, even when a clad material is drawn, there is a possibility that corrosion may occur at a portion where a base material is exposed, such as a cut surface or a welded portion. In addition, the copper-based material has good conductivity, but the strength thereof may decrease due to the thinning.

Therefore, it is an object of the present invention to provide a cylindrical member, a contact probe, and a semiconductor inspection socket for which electrical conductivity and strength are ensured.

Solution to Problem

In order to attain the above object, a cylindrical member, a contact probe and a semiconductor inspection socket according to the present invention adopt the following solutions.

A cylindrical member according to an aspect of the present invention is a cylindrical member for use in a contact probe which comprises: a cylindrical base material including a portion at which opposing sides of a plate material made of beryllium copper are butted against each other, the portion extending along an axial line direction; a first coating layer that is formed on each of an inner surface and an outer surface of the base material and made of a Ni-based material and serves as a reinforcing material for the base material; and a second coating layer that is formed on a surface of each of the first coating layers and made of a metal-based material different from the base material, wherein the first coating layer has higher hardness than the base material, and when a thickness of the base material is represented by $T_B$ and a layer thickness of the first coating layer formed on the outer surface is represented by $T1_{OUT}$, the base material is formed so as to satisfy 13 µm≤$T_B$≤25 µm, and the first coating layer is formed so as to satisfy $T1_{OUT} \geq T_B \times 4\%$.

In the cylindrical member according to the present aspect, since the cylindrical base material in which the portion where the opposing sides of the plate material are butted against each other extends along the axial line direction is made of beryllium copper, the wall thickness of the base material can be reduced while ensuring conductivity. This is useful for reducing the diameter of the cylindrical member (for example, barrel) in connection with narrowing of the pitch of the contact probes. Further, beryllium copper is excellent in fatigue resistance and workability (formability), and thus is suitable as a material to be used for processing of butting the butting sides along the axial line direction (for example, press working). In other words, by using beryllium copper, it is possible to secure the conductivity of the thinned base material and enhance the workability of the thinned base material.

Further, since the first coating layer made of the Ni-based material is set to have a higher hardness than the base material, the first coating layer made of the Ni-based material can be caused to act as a reinforcing material for the base material made of beryllium copper. The hardness (for example, Vickers hardness) of beryllium copper is, for example, 350 Hv-450 Hv (after age-hardening treatment), and the hardness (likewise, Vickers hardness) of the Ni plating is, for example, 100 Hv-1000 Hv. However, by daring to select the hardness of the first coating layer made of Ni-based material which is higher than the hardness of the base material made of beryllium copper, the first coating layer can be caused to act as a reinforcing material for the base material.

When the thickness of the base material is represented by $T_B$ and the layer thickness of the first coating layer formed on the outer surface is represented by $T1_{OUT}$, the base material is formed so as to satisfy 13 µm≤$T_B$≤25 µm, and the first coating layer is formed so as to satisfy $T1_{OUT}$≥$T_B$×4%. Therefore, the minimum required strength can be ensured by the first coating layer (Ni layer) which is as thin as possible while thinning the base material made of beryllium copper as much as possible.

In the cylindrical member according to the aspect of the present invention, when the layer thickness of the second coating layer on the inner surface side is represented by $T2_{IN}$, the second coating layer is formed so as to satisfy $T2_{IN}$≥0.05 µm.

In the cylindrical member according to the present aspect, since the second coating layer is formed so as to satisfy $T2_{IN}$≥0.05 µm, it is possible to reduce the conductor resistance of the second coating layer formed on the inner surface side, which makes it possible to stabilize the current flowing through the cylindrical member. Note that the second coating layer is formed, for example, to suppress an increase in contact resistance due to oxidation of a contact portion with a plunger and prevent corrosion.

Further, in the cylindrical member according to the aspect of the present invention, the first coating layer and/or the second coating layer is applied by a plating treatment.

In the cylindrical member according to the present aspect, since the first coating layer and/or the second coating layer is applied by a plating treatment, both electrical characteristics and securement of the strength can be realized at the same time by controlling the thickness of the plating layer.

In the cylindrical member according to the aspect of the present invention, the opposing sides are provided with notches which form the through-hole by butting the opposing sides against each other.

In the cylindrical member according to the present aspect, since the opposing sides are provided with notches which form a through-hole by butting the opposing sides against each other, the through-hole can be easily formed simultaneously with the processing of the base material.

Further, when the first coating layer and the second coating layer are applied by a plating treatment, the through-hole can promote circulation of plating solution. Therefore, uniform plating can be applied to the base material.

Further, a contact probe according to an aspect of the present invention includes the above-mentioned cylindrical member.

A semiconductor inspection socket according to an aspect of the present invention includes the above-mentioned contact probe.

Advantageous Effects of Invention

According to the present invention, it is possible to provide a cylindrical member, a contact probe, and a semiconductor inspection socket for which electrical conductivity and strength are ensured.

DESCRIPTION OF EMBODIMENTS

A cylindrical member, a contact probe, and a semiconductor inspection socket according to an embodiment of the present invention will be described below with reference to the drawings.

First, a semiconductor inspection socket 1 (hereinafter, simply referred to as "socket 1") for which a contact probe 30 having a cylindrical member (barrel) 32 according to the present embodiment is adopted will be described.

Figure 1:
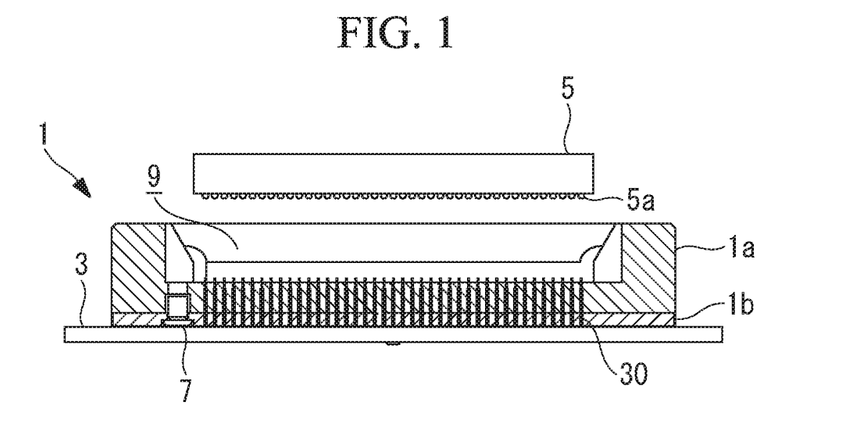
FIG. 1 is a longitudinal sectional view showing a state before an IC package is attached to a socket for which a contact probe having a barrel according to an embodiment of the present invention is adopted.
Figure 2:
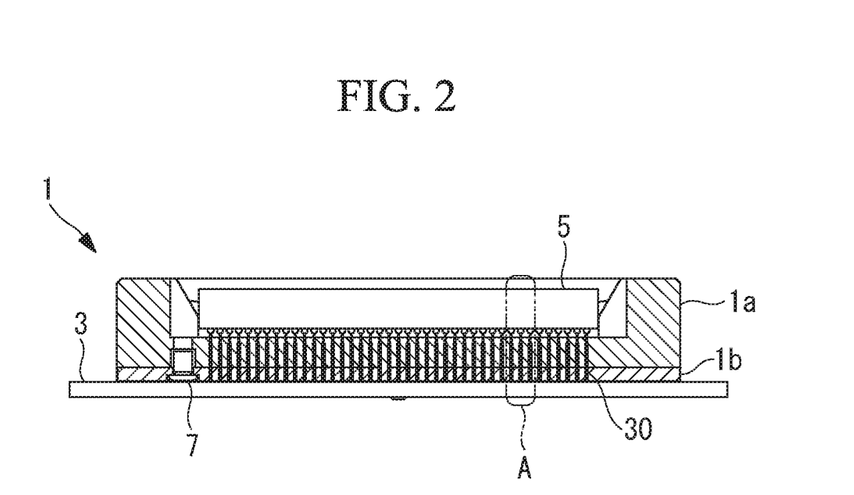
FIG. 2 is a longitudinal sectional view showing the socket shown in FIG. 1 with the IC package being attached to the socket.

FIG. 1 shows the socket 1 before an IC package (inspection target device) 5 is attached. FIG. 2 shows the socket 1 with the IC package 5 being attached to the socket 1.

The socket 1 is placed, for example, on a printed wiring board 3 (hereinafter simply referred to as "board 3") as a test board. The socket 1 and the board 3 are fixed to each other by a fastening member or the like (not shown).

The socket 1 includes an upper socket body 1a, and a probe array board 1b attached to the socket body 1a from the lower side. The socket body 1a and the probe array board 1b are formed of insulating members. The socket body 1a and the probe array board 1b are positioned relatively to each other by a positioning pin (not shown) or the like, and then fixed to each other by a fixing bolt 7.

A device accommodating portion 9 for accommodating the IC package 5 is formed on the upper surface of the socket body 1a. The device accommodating portion 9 is configured as a recessed site which is formed so as to be recessed downward from the upper surface of the socket body 1a.

A plurality of contact probes 30 are provided below the device accommodating portion 9 so as to extend in a vertical direction while being arranged side by side. The contact probes 30 are arranged side by side at a pitch of about 0.3 mm. The electrical conduction between the board 3 and the IC package 5 is established by the contact probes 30.

As shown in FIG. 1, a plurality of solder balls 5a as electrodes are provided on the lower surface of the IC package 5.

As shown in FIG. 2, the IC package 5 attached to the socket 1 is accommodated in the device accommodating portion 9.

Figure 3:
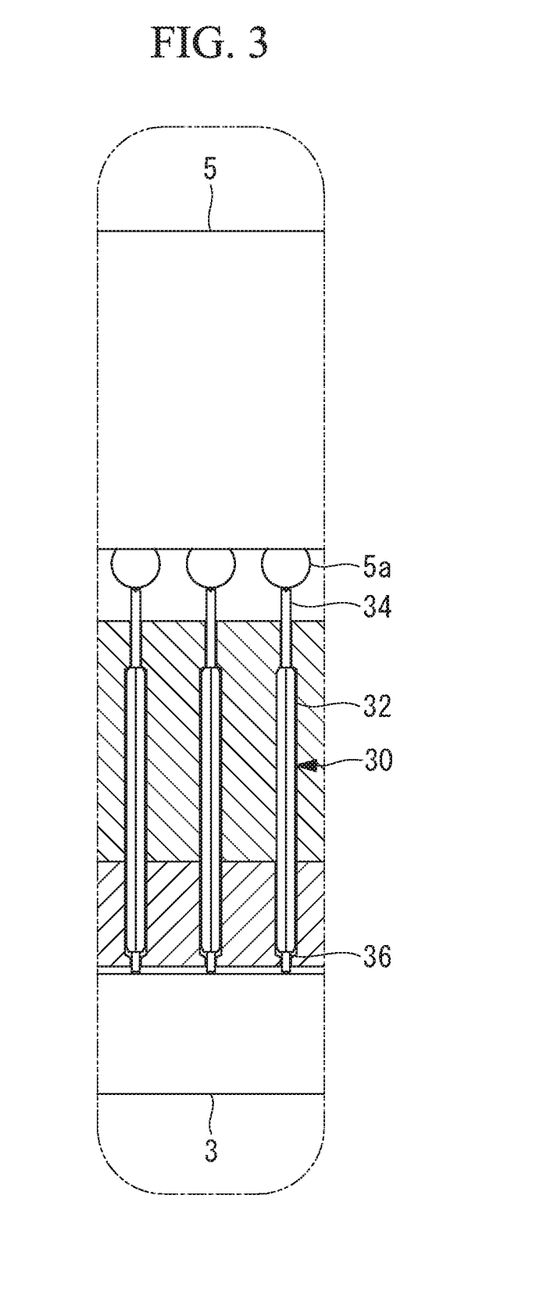
FIG. 3 is a partially enlarged view of a portion A shown in FIG. 2.

FIG. 3 shows a partially enlarged view of a portion A of FIG. 2. The upper end of each contact probe 30 (specifically, the upper end of a contact portion 34a equipped to an upper plunger 34) is in contact with each solder ball 5a of the IC package 5 while the IC package 5 is accommodated in the device accommodating portion 9. As a result, the IC package 5 and each contact probe 30 are brought into electrical contact with each other, and the IC package 5 and the board 3 are brought into electrical conduction with each other.

Next, the barrel 32 and the contact probe 30 according to the present embodiment will be described.

Figure 4:
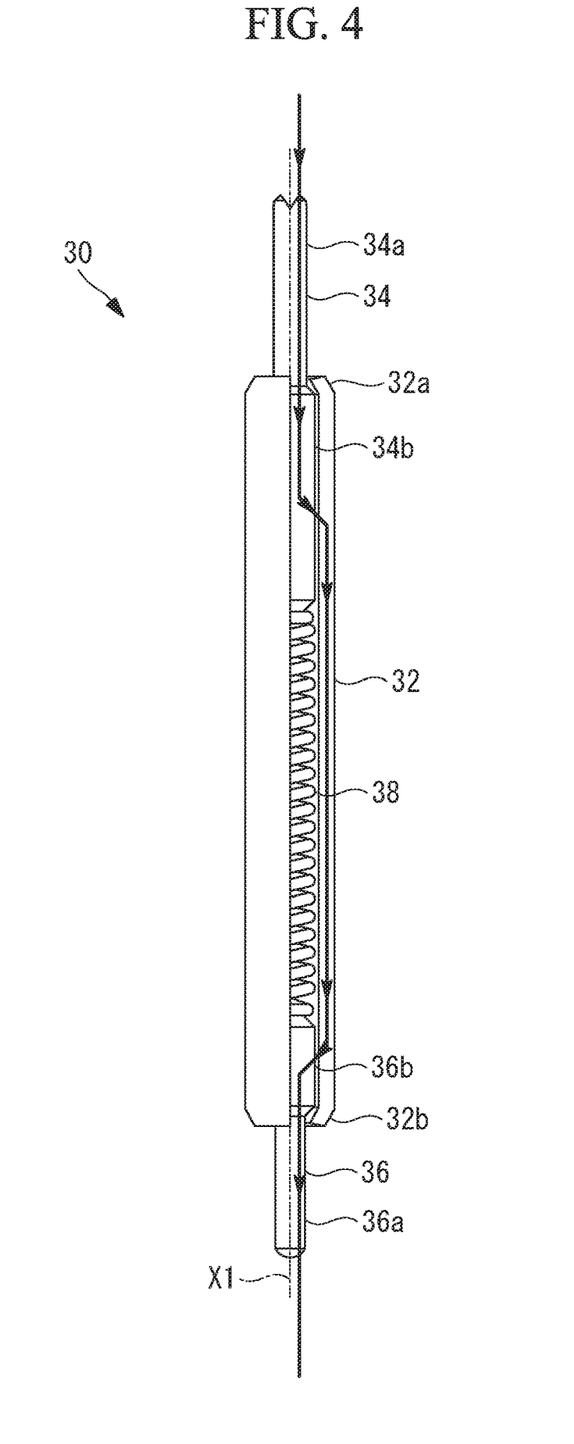
FIG. 4 is a diagram showing the contact probe according to the embodiment of the present invention.

FIG. 4 shows the contact probe 30. Note that a right side of FIG. 4 with respect to a central axial line X1 is shown as a cross-section. Further, arrows in FIG. 4 show a current flowing from the IC package 5 to the board 3, and it cannot be visually recognized in practice.

The contact probe 30 includes the barrel 32 configured in a cylindrical shape having the central axial line X1, the upper plunger 34 arranged on an upper end 32a side in the barrel 32, a lower plunger 36 arranged on a lower end 32b side in the barrel 32, and a coil spring 38 inserted in the barrel 32.

The upper plunger 34 and the lower plunger 36 are made of metal, and for example, for a base material such as beryllium copper, phosphor bronze, or SK material, plated with nickel gold, or a palladium alloy which is not plated is used for the upper plunger 34 and the lower plunger 36.

The upper plunger 34 is configured in a round-bar shape having the central axial line X1 which is common to the barrel 32. The upper plunger 34 includes the contact portion 34a located at the upper tip thereof, and a large-diameter portion 34b which is connected to the lower end of the contact portion 34a and is larger in diameter than the contact portion 34a.

Likewise, the lower plunger 36 is configured in a round-bar shape having the central axial line X1 which is common to the barrel 32. The lower plunger 36 includes a contact portion 36a which is located at the lower tip thereof, and a large-diameter portion 36b which is connected to the upper end of the contact portion 36a and is larger in diameter than the contact portion 36a.

The barrel 32 is a member having a cylindrical shape, and accommodates the large-diameter portion 34b of the upper plunger 34 and the large-diameter portion 36b of the lower plunger 36 therein.

The upper end 32a of the barrel 32 is formed such that the diameter of the end portion thereof decreases over the entire circumference thereof. The inner diameter of the tip of the upper end 32a is set to be smaller than the outer diameter of the large-diameter portion 34b of the upper plunger 34, which prevents the upper plunger 34 from coming off the upper end 32a of the barrel 32 to the outside of the barrel 32.

Likewise, the lower end 32b of the barrel 32 is formed such that the diameter of the end portion decreases over the entire circumference thereof. The inner diameter of the tip of the lower end 32b is set to be smaller than the outer diameter of the large-diameter portion 36b of the lower plunger 36, which prevents the lower plunger 36 from coming off the lower end 32b of the barrel 32 to the outside of the barrel 32.

The coil spring 38 formed of, for example, a piano wire or a stainless wire is accommodated between the upper plunger 34 and the lower plunger 36 inside the barrel 32.

The coil spring 38 is configured to be capable of expanding and contracting along the direction of the central axial line X1, and biases the upper plunger 34 and the lower plunger 36 accommodated in the barrel 32 in a direction in which the upper plunger 34 and the lower plunger 36 are separated from each other.

Next, details of the barrel 32 will be described.

Figure 5:
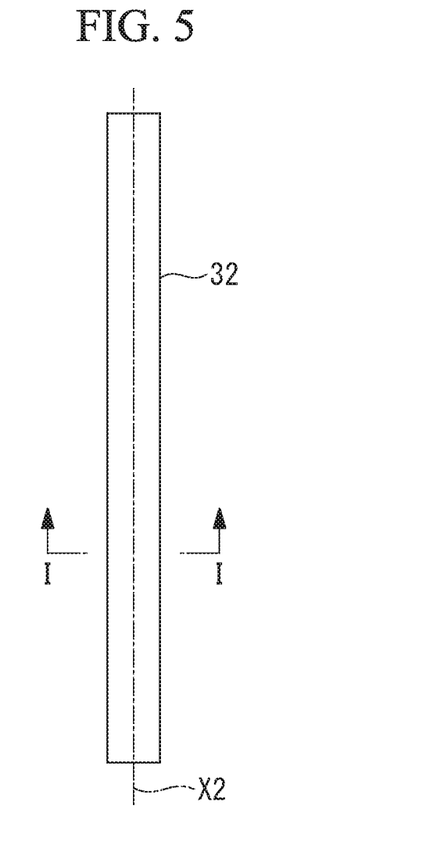
FIG. 5 is a diagram showing the barrel according to the embodiment of the present invention.
Figure 6:
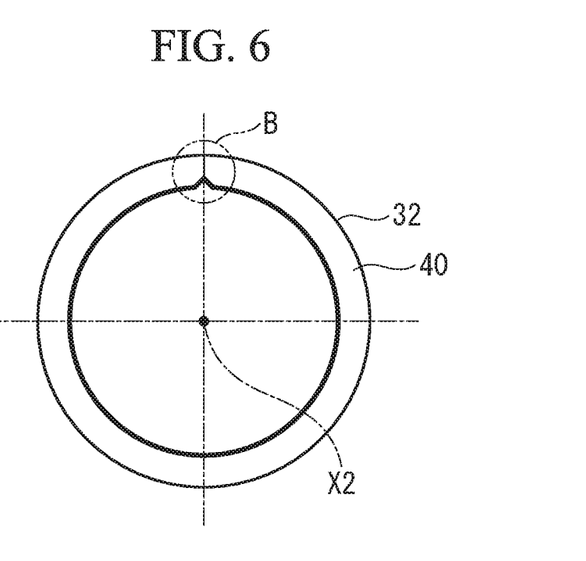
FIG. 6 is a cross-sectional view taken along a section line I-I shown in FIG. 5.
Figure 7:
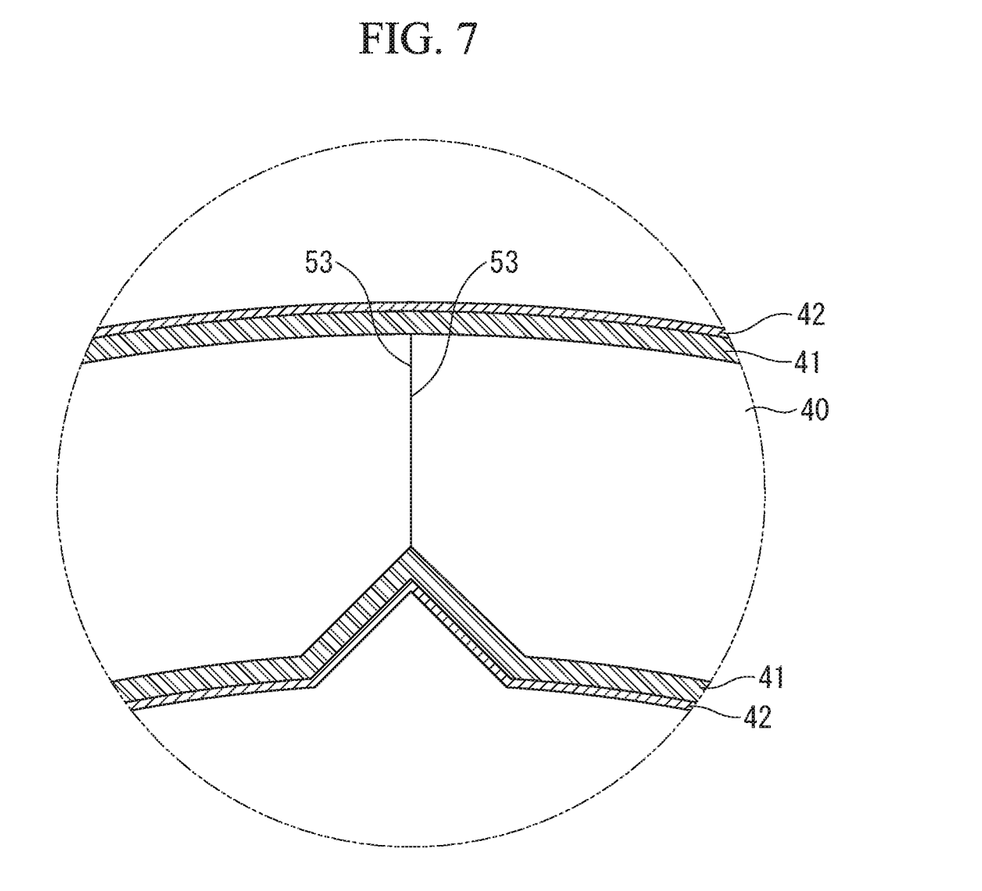
FIG. 7 is a partially enlarged view of a portion B shown in FIG. 6.

FIG. 5 shows the barrel 32 according to the present embodiment. FIG. 6 is a cross-sectional view taken along a section line I-I of FIG. 5. FIG. 7 is a partially enlarged view of a portion B of FIG. 6.

As shown in FIGS. 5 and 6, the barrel 32 is configured as a cylindrical member extending in the direction of a central axial line X2.

As shown in FIGS. 6 and 7, the barrel 32 includes a base material 40 formed in a cylindrical shape, a first coating layer 41 formed on the surface of the base material 40, and a second coating layer 42 formed on the periphery of the first coating layer 41.

The base material 40 is formed by press working, for example. When the thickness of the base material 40 is represented by $T_B$ (hereinafter, also referred to as "thickness $T_B$"), 15 $\mu m \leq T_B \leq 25$ $\mu m$ (preferably 15 $\mu m \leq T_B \leq 20$ $\mu m$) holds. Further, the base material 40 is formed so that the outer diameter thereof is about 0.21 mm. As a result, a space having a diameter of about 0.16 mm or more is formed inside the base material 40.

The base material 40 is formed of a copper-based material, for example, beryllium copper. Beryllium copper which is suitable for press working and has good conductivity is preferable, and for example, low beryllium copper for spring (alloy number in JIS standard: C1751, alloy number in American Society for Testing and Materials: C17510) is used. As a result, the manufacturability of the base material 40 by press working is enhanced, and the base material 40 having good conductivity is manufactured. The copper-based material constituting the base material 40 preferably has a lower electrical resistivity than a metal-based material constituting the first coating layer 41 described later. As a result, a current to flow during energization can be made to mainly flow through the base material 40.

As shown in FIG. 7, the first coating layer 41 is formed so as to directly coat the surfaces (both the surfaces of the inner surface and the outer surface) of the cylindrical base material 40. The first coating layer 41 is made of a metal-based material (for example, a Ni-based material) different from the base material 40, and is formed to have a higher hardness than the base material 40 (beryllium copper) under the coating.

Note that the hardness of beryllium copper as the material of the base material 40 (for example, Vickers hardness) is, for example, 350 Hv-450 Hv (after age-hardening treatment), and the hardness of Ni plating (likewise, Vickers hardness) is, for example, 100 Hv-1000 Hv, and thus Ni-based materials do not always have higher hardness than beryllium copper. In the present embodiment, the first coating layer 41 is formed so as to have a hardness higher than that of the copper-based material constituting the base material 40 under the coating from the range of hardness that each material can have. As a result, the first coating layer 41 is enabled to act as a reinforcing material for the base material 40.

The second coating layer 42 is formed so as to coat the surfaces (both the inner surface and the outer surface) of the base material 40 with the first coating layer 41 as a base. The second coating layer 42 is made of a metal-based material different from that of the base material 40, and includes, for example, an Au-based material or a material containing a platinum group-based material as a main component.

The second coating layer 42 of Au-based material is, for example, hard gold plating (particularly gold cobalt plating). When the second coating layer 42 is formed of a platinum group-based material, the material is, for example, Pd (palladium), Rh (rhodium), Pt (platinum), or the like. The second coating layer 42 can suppress corrosion and abrasion of the barrel 32. Furthermore, the second coating layer 42 can establish good electrical contact between the barrel 32 and each of the upper plunger 34 and the lower plunger 36 accommodated in the barrel 32. The second coating layer 42 can also suppress an increase in contact resistance caused by oxidation of a contact portion with the upper plunger 34 and/or the lower plunger 36.

As shown in FIG. 3, the contact probe 30 including the barrel 32 brings the IC package 5 and the board 3 into electrical conduction with each other, and at that time, current flows through the contact probe 30 as follows.

That is, as shown in FIG. 4, a current flowing from the IC package 5 (not shown) to the upper plunger 34 flows to the large-diameter portion 34b via the contact portion 34a. At this time, the large-diameter portion 34b is in contact with the barrel 32 via the second coating layer 42 having good conductivity, so that the current flowing through the large-diameter portion 34b flows, not into the coil spring 38, but into the barrel 32. The current flowing through the barrel 32 flows through the base material 40 and then through the large-diameter portion 36b of the lower plunger 36. Thereafter, the current flows into the board 3 (not shown) via the contact portion 34a.

Next, the layer thicknesses of the first coating layer 41 and the second coating layer 42 will be described in detail.

The first coating layer 41 is formed to be thicker as compared with a case where the first coating layer 41 is simply used as a base for the second coating layer 42. In particular, the thickness $T1_{OUT}$ of the first coating layer 41 to be formed on the outer surface side of the base material 40 (hereinafter also referred to as "layer thickness $T1_{OUT}$") is set to satisfy $T1_{OUT} \geq T_B \times 4.0\%$ (condition 1) for the thickness $T_B$. For example, for $T_B=25$ µm, $T1_{OUT} \geq 1$ µm, and for $T_B=20$ µm, $T1_{OUT} \geq 0.8$ µm. The condition 1 relating to the layer thickness $T1_{OUT}$ is set based on the knowledge obtained by a test (described later) conducted by the inventors.

Note that the layer thickness $T1_{IN}$ of the first coating layer 41 formed on the inner surface side of the base material 40 (hereinafter also referred to as "layer thickness $T1_{IN}$") is preferably set to satisfy $T1_{IN} \leq T1_{OUT}$.

Since the Ni-based material is generally considered to have high strength, the base material 40 can be reinforced by the first coating layer 41 (especially, the first coating layer 41 formed on the outer surface side) formed to be thicker as compared with a case where the first coating layer 41 is used as a base. In other words, the first coating layer 41 of the Ni-based material acts as not only the base for the second coating layer 42, but also a reinforcing material for enhancing the strength of the barrel 32.

Note that, for example when copper-based base metal (the base material 40 in the present embodiment) is subjected to gold plating, the "base" used in the specification is a layer to be interposed between the copper-based base metal and the gold plating in order to suppress the base metal from diffusing onto the surface of the gold plating. Therefore, when the first coating layer 41 is used only as a base, the maximum thickness thereof may be set to a thickness required to suppress metal diffusion (for example, about 0.5 µm).

The thickness $T2_{IN}$ of the second coating layer 42 to be formed on the inner surface side of the base material 40 (hereinafter, also referred to as "layer thickness $T2_{IN}$") for the first coating layer 41 is preferably set to satisfy $T2_{IN}$ 0.05 µm (condition 2), and more preferably set to satisfy $T2_{IN}$ 0.3 µm. By setting $T2_{IN} \geq 0.05$ µm, the conductor resistance of the second coating layer 42 formed on the inner surface side is reduced, so that the current flowing through the barrel 32 can be stabilized. Furthermore, by setting $T2_{IN} \geq 0.3$ µm, the conductor resistance of the second coating layer 42 can be reduced, and also the durability of the second coating layer 42 can be enhanced.

Note that the layer thickness $T2_{OUT}$ of the second coating layer 42 to be formed on the outer surface side of the base material 40 (hereinafter also referred to as "layer thickness $T2_{OUT}$") may be thinner than the layer thickness $T2_{IN}$. This is because the second coating layer 42 to be formed on the outer surface side is not a coating layer for passing a current therethrough, and therefore it is not necessary to reduce the conductor resistance unlike the second coating layer 42 to be formed on the inner surface side. In other words, the maximum layer thickness of the second coating layer 42 to be formed on the outer surface side may be set to the layer thickness $T2_{out}$ required to secure corrosion resistance and abrasion resistance.

In the determination of the thickness of the first coating layer 41, the inventors have obtained the knowledge regarding the thickness of the first coating layer 41 by the following test.

Figure 8:
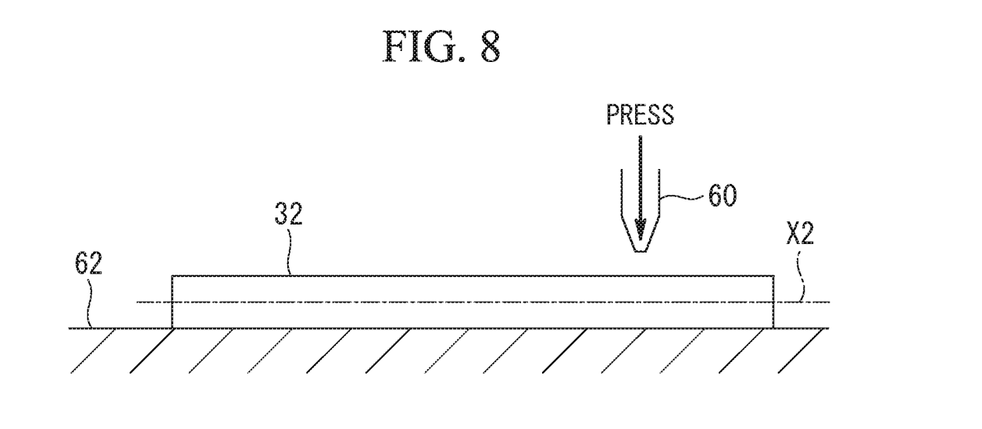
FIG. 8 is a diagram showing a state of a barrel pressing test.

As shown in FIG. 8, the inventors conducted a test in which the barrel 32 as a device under test which was placed on a test stand 62 so that the central axial line X2 was along a horizontal direction was pressed downwardly in a vertical direction by a test piece 60.

A contact surface of the test piece 60 with the barrel 32 has a width of about 0.3 mm along the direction of the central axial line X2. The shape of the contact surface of the test piece 60 assumes the shape of tweezers used by an operator.

Figure 9:
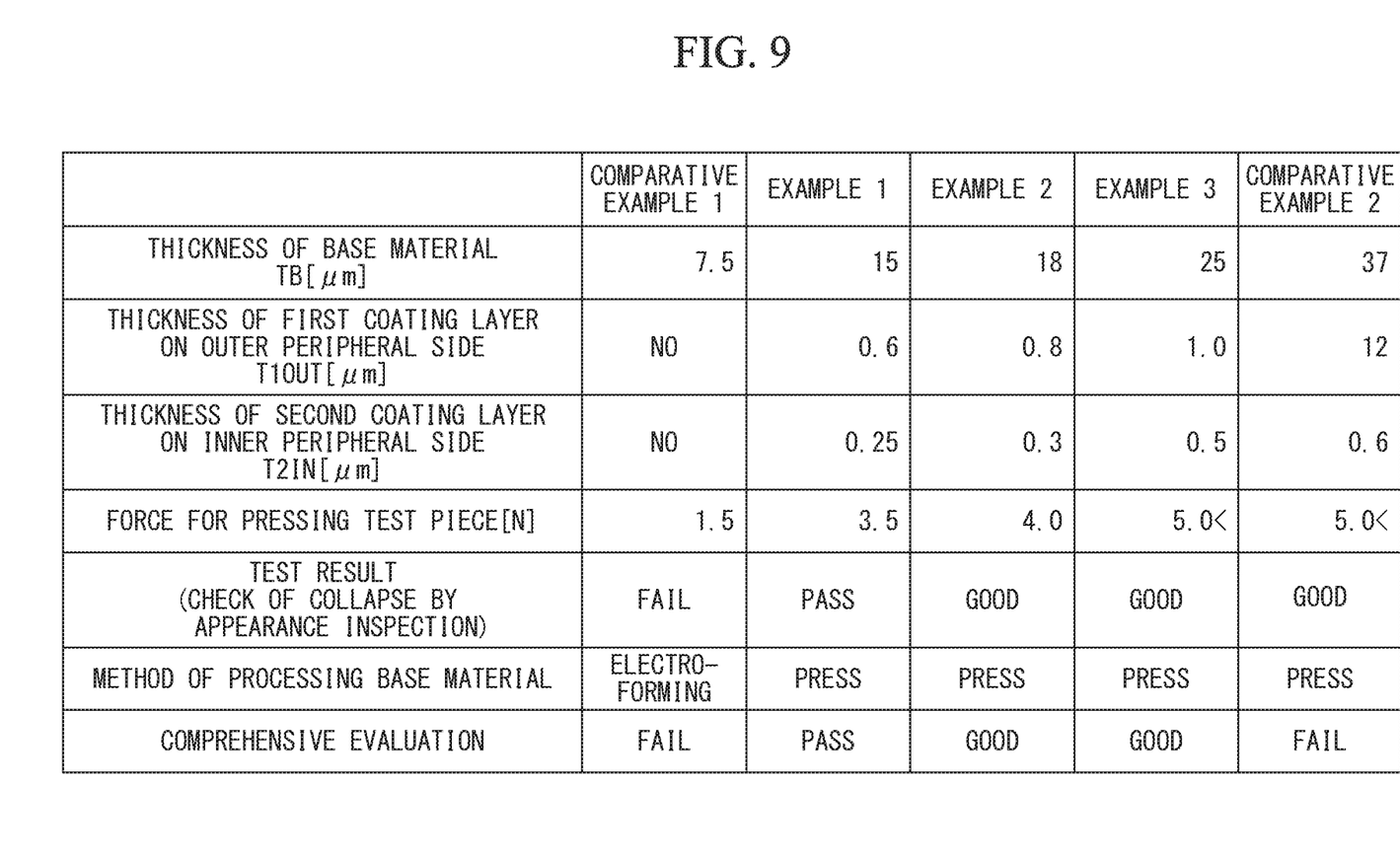
FIG. 9 is a diagram showing a result of the pressing test (including Comparative Examples).

As shown in FIG. 9, five types of base materials which were different in thickness $T_B$ were prepared as the base material 40 constituting the barrel 32. Three types out of the five types were prepared as Examples 1 to 3, and the remaining two types were prepared as Comparative Examples 1 and 2 for comparison.

Hereinafter, Examples 1 to 3 and Comparative Examples 1 and 2 will be described.

EXAMPLE 1

The thickness $T_B=15$ µm, the layer thickness $T1_{OUT}=0.6$ µm (4% of the thickness $T_B$), and the layer thickness $T2_{IN}=0.25$ µm (1.7% of the thickness $T_B$) were set in Example 1. Note that the cylindrical base material 40 was formed by press working.

As a result, when the test piece 60 was pressed with force of about 3.5 N, the appearance of the barrel 32 began to collapse.

EXAMPLE 2

The thickness $T_B=18$ µm, the layer thickness $T1_{OUT}=0.8$ µm (4.4% of the thickness $T_B$), and the layer thickness $T2_{IN}$=0.3 μm (1.7% of the thickness $T_B$) were set in Example 2. Note that the cylindrical base material 40 was formed by press working.

As a result, when the test piece 60 was pressed with force of about 4.0 N, the appearance of the barrel 32 began to collapse.

EXAMPLE 3

The thickness $T_B$=25 μm, the layer thickness $T1_{OUT}$=1.0 μm (4% of the thickness $T_B$), and the layer thickness $T2_{IN}$=0.5 μm (2.0% of the thickness $T_B$) were set in Example 3. Note that the cylindrical base material 40 was formed by press working.

As a result, no collapse occurred in the appearance of the barrel 32 even when the test piece 60 was pressed with force of about 5.0 N.

Comprehensive Evaluation of Examples 1 to 3

The barrel 32 is handled with a holding tool such as tweezers by an operator. At this time, force acting on the barrel 32 sandwiched by the tweezers is about 3.5 N or more. Therefore, if the barrel 32 has a strength enough to endure force of about 3.5 N, the strength is secured for the barrel 32.

From results of Examples 1 to 3, it has been confirmed that it is possible to provide the barrel 32 in which the minimum strength is ensured under the condition of Example 1 and the sufficient strength is ensured under the conditions of Examples 2 and 3. At this time, in consideration of the processing of the base material 40, the thickness $T_B$ may be set to 13 μm. In this case, the strength of the barrel 32 can be secured by making the layer thickness $T1_{OUT}$ larger than that of Example having the thickness $T_B$=15 μm (for example, $T1_{OUT}$=0.8 μm (6% of the thickness $T_B$).

From the foregoing, there was obtained the knowledge that $T1_{OUT} \geq T_B \times 4.0\%$ (condition 1) was set for 13 μm≤$T_B$≤25 μm.

It is needless to say that if the strength of the barrel 32 can be ensured, ranges in which the thickness $T_B$ and the layer thickness $T1_{OUT}$ can be set can be adjusted appropriately. In this case, the ranges in which the thickness $T_B$ and the layer thickness $T1_{OUT}$ can be set are adjusted in consideration of the pitch of the contact probes 30 and the maximum outer diameter which the barrel 32 can take. At the same time, the ranges which the thickness $T_B$ and the layer thickness $T1_{OUT}$ can take are adjusted so that a space for accommodating the upper plunger 34, the lower plunger 36 and the coil spring 38 therein can be secured inside the barrel 32.

COMPARATIVE EXAMPLE 1

In Comparative Example 1, the thickness $T_B$ was set to 7.5 μm, and neither the first coating layer 41 nor the second coating layer 42 was formed. The cylindrical base material 40 was formed by electroforming.

As a result, when the test piece 60 was pressed with force of about 1.5 N, collapse occurred in the appearance of the barrel 32.

COMPARATIVE EXAMPLE 2

In Comparative Example 2, the thickness $T_B$ was set to 37 μm, the layer thickness $T1_{OUT}$ was set to 12 μm so as to satisfy the condition 1, and the layer thickness $T2_{IN}$ was set to 0.6 μm so as to satisfy the condition 2. The cylindrical base material 40 was formed by press working.

As a result, even when the test piece 60 was pressed with force of about 5.0 N, no collapse occurred in the appearance of the barrel 32, and the condition 1 was verified.

Next, a method of manufacturing the barrel 32 will be described with reference to FIG. 10.

The method of manufacturing the barrel 32 includes a step of forming the base material 40, a step of forming the first coating layer 41, and a step of forming the second coating layer 42. Hereinafter, each step will be described in detail.

<Step of Forming Base Material>

The base material 40 is formed by conducting press working on a band-shaped plate material 50 made of beryllium copper (the same material as the base material 40). The thickness of the plate material 50 corresponds to the wall thickness (thickness $T_B$) required for the base material 40.

Note that the plate material 50 is preferably an aging material (a material before age-hardening treatment) from the viewpoint of fatigue resistance and workability (formability).

The details of the press working will be described below. The steps of the press working proceed in the order of (a) to (f) shown in FIG. 10. Here, the description of (a) to (f) in the drawing is for explanation. Further, an upper diagram of FIG. 10 is a plan view in which the working step of the plate material 50 is viewed planarly, and a lower diagram of FIG. 10 is a front view corresponding to the plan view.

Figure 10:
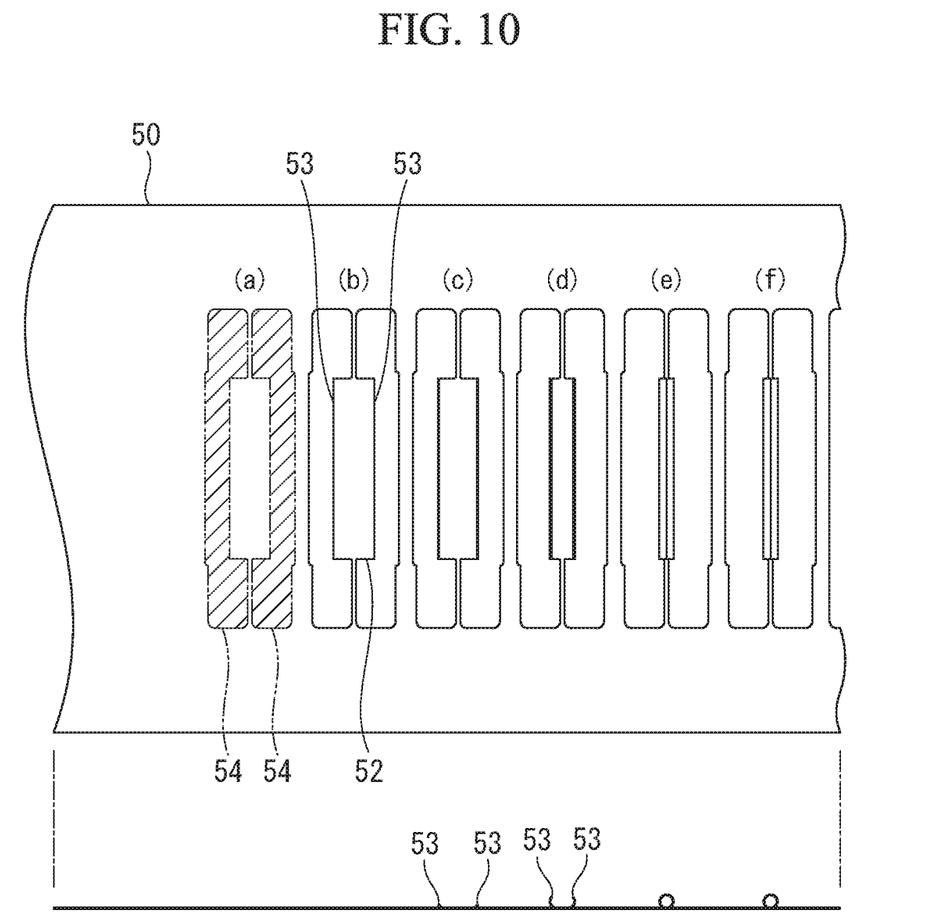
FIG. 10 is a plan view showing processing steps of a base material and a front view corresponding thereto.

First, as shown in (a) of FIG. 10, cut-out portions 54 indicated by hatching in (a) of FIG. 10 are cut off from the plate material 50, so that a plate material 52 having a predetermined shape is formed as shown in (b) of FIG. 10.

Next, as shown in (c) to (e) of FIG. 10, the working is performed so that corresponding sides (butting sides 53) of the plate material 52 having a predetermined shape are rolled inward. Finally, as shown in (f) of FIG. 10, the working is performed so that the butting sides 53 on both sides are butted against each other and brought into contact with each other to thereby form a cylindrical base material 40. Thereafter, the base material 40 formed in a cylindrical shape is cut out from the plate material 50.

Next, the base material 40 cut out from the plate material 50 is hardened by a heat treatment. The heat treatment is performed based on an age-hardening curve for about 2 hours, for example, in a temperature range of not less than 300° C. to not more than 500° C. (at least a temperature range in which beryllium is precipitated).

<Step of Forming First Coating Layer>

The first coating layer 41 is formed on the heat-treated base material 40 by a plating treatment. At this time, the plating treatment is performed so that the layer thickness $T1_{OUT}$ of the first coating layer 41 on the outer surface side satisfies $T1_{OUT} \geq T_B \times 4.0\%$ according to the condition 1.

<Step of Forming Second Coating Layer>

The second coating layer 42 is applied to the base material 40 having the first coating layer 41 formed thereon by a plating treatment. At this time, the plating treatment is performed so that the layer thickness $T2_{IN}$ of the second coating layer 42 on the inner surface side satisfies $T2_{IN}$ 0.05 μm according to the condition 2.

The barrel 32 including the base material 40, the first coating layer 41, and the second coating layer 42 is formed through the above steps. Note that the outer diameter of the barrel 32 is set to about 0.21 mm or less in consideration of the outer diameter and thickness $T_B$ of the base material 40, the layer thickness of the first coating layer 41, and the layer thickness of the second coating layer 42. As a result, the contact probes 30 can be arranged side by side at a pitch of 0.3 mm. Further, the inner diameter of the barrel 32 is set to about 0.16 mm or more. As a result, a space for accommodating the upper plunger 34, the lower plunger 36 and the coil spring 38 therein can be secured inside the barrel 32.

As described above, according to the present embodiment, the following effects are obtained.

Since the cylindrical base material 40 is made of beryllium copper, it is possible to realize thinning while ensuring conductivity. This is useful for reduction of the diameter of the barrel 32 in connection with the narrowed pitch of the contact probes 30. Further, beryllium copper is excellent in fatigue resistance and workability (formability), and is therefore suitable as a material used for press working in which the butting sides 53 are butted against each other along the direction of the central axial line X2. In other words, by using beryllium copper, it is possible to secure the conductivity of the thinned base material 40 and enhance the workability of the thinned base material 40.

Further, since the first coating layer 41 made of the Ni-based material has a higher hardness than the base material 40, the first coating layer 41 made of the Ni-based material can be caused to act as a reinforcing material for the base material 40 made of beryllium copper. The hardness (for example, Vickers hardness) of beryllium copper is, for example, 350 Hv-450 Hv (after the age-hardening treatment), and the hardness (likewise, Vickers hardness) of Ni plating is, for example, 100 Hv-1000 Hv. However, by daring to select the hardness of the first coating layer 41 which is higher than the hardness of the base material 40 made of beryllium copper, the first coating layer 41 can be caused to act as a reinforcing material for the base material 40.

When the thickness of the base material 40 is represented by $T_B$ and the layer thickness of the first coating layer 41 formed on the outer surface is represented by $T1_{OUT}$, the base material 40 is formed so as to satisfy 13 µm≤$T_B$≤25 µm, and the first coating layer 41 is formed so as to satisfy $T1_{OUT}$≥$T_B$×4%, so that the minimum required strength can be secured by the first coating layer 41 which is as thin as possible while thinning the base material 40 made of beryllium copper as much as possible.

Note that the Ni-based material which is the material of the first coating layer 41 is generally inferior in conductivity to the copper-based material. However, by combining the Ni-based material (first coating layer 41) with the copper-based material (base material 40) such as beryllium copper having good conductivity, a conductivity-related disadvantage of the Ni-based material can be supplemented by the conductivity of beryllium copper. Therefore, even if the first coating layer 41 is thickly coated to ensure strength, the conductivity of the barrel 32 is guaranteed.

Moreover, the strength of the barrel 32 is set to be endurable even when the test piece 60 in the above-mentioned test is pressed with force of about 3.5 N. As a result, even when an operator pinches the barrel 32 by using a holding tool such as tweezers, the barrel 32 can be avoided from being damaged due to the pinching work.

Since the second coating layer 42 is formed so as to satisfy $T2_{IN}$≥0.05 µm, the conductor resistance of the second coating layer 42 formed on the inner surface side can be reduced, which makes it possible to stabilize the current flowing through the barrel 32.

Further, since the first coating layer 41 and/or the second coating layer 42 is applied by a plating treatment, it is possible to realize both the electrical characteristics and securement of the strength at the same time by controlling the thickness of the plating layer.

First Modification

Figure 11:
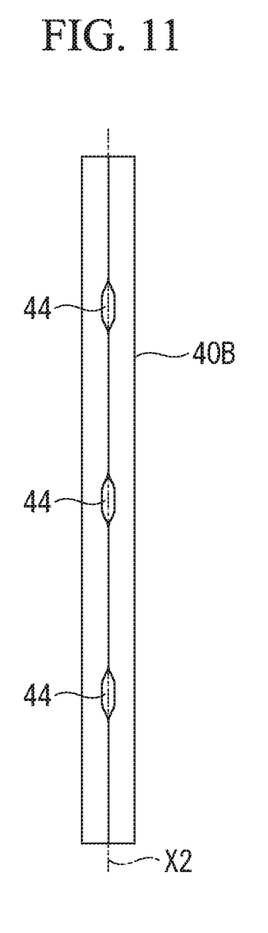
FIG. 11 is a diagram showing a base material according to a first modification.

A cylindrical base material 40B may be configured to have a form shown in FIG. 11 as well as a simple cylindrical form.

As shown in FIG. 11, plating holes (through-holes) 44 for causing the inside and the outside of the base material 40 to communicate with each other are formed on the surface of the base material 40B. In the case of FIG. 11, three plating holes 44 are formed along the direction of the central axial line X2. As a result, when the first coating layer 41 and the second coating layer 42 are applied by the plating treatment, circulation of plating solution can be promoted, which makes it possible to easily apply uniform plating to the base material 40B.

Note that the number of the plating holes 44 may be one or two, or may be four or more, and it is arbitrarily changed according to the shape of the barrel 32 and other specifications. At this time, it is preferable that at least one plating hole 44 is formed at a central portion of the base material 40B along the direction of the central axial line X2.

Figure 12:
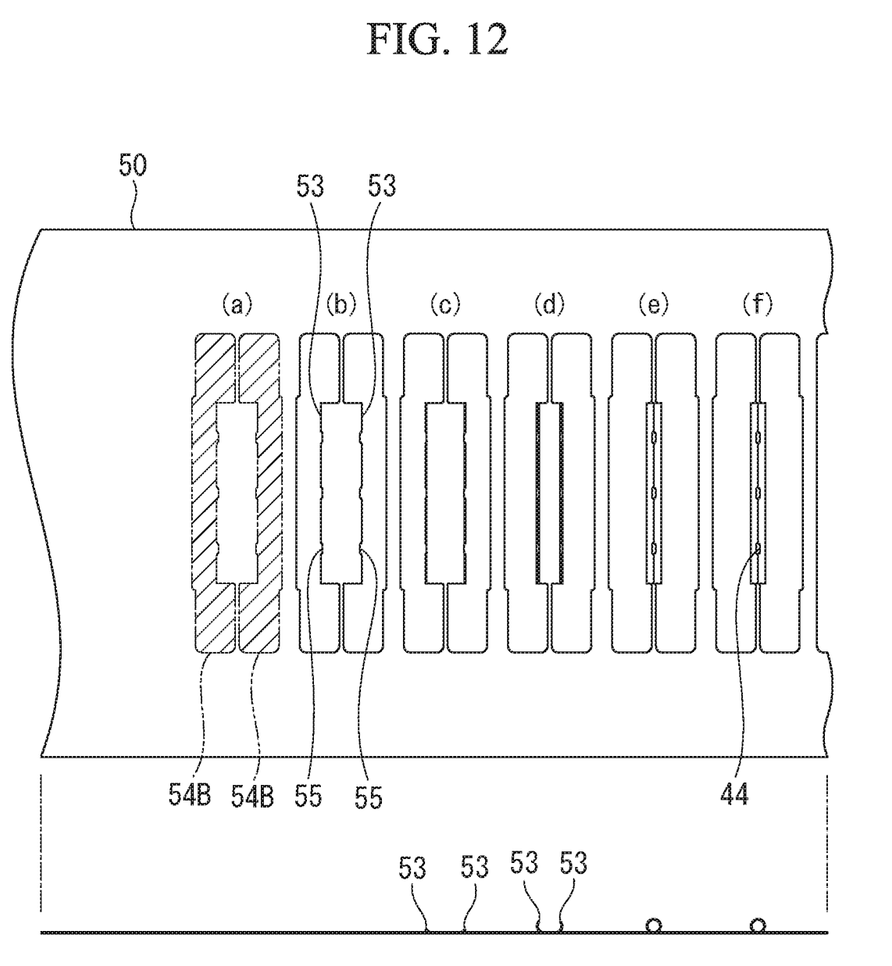
FIG. 12 is a plan view showing processing steps of the base material according to the first modification and a front view corresponding thereto.

Like the base material 40, the base material 40B in which the plating holes 44 are to be formed is formed in a cylindrical shape by performing press-working on a band-shaped plate material 50.

As shown in (a) of FIG. 12, notches 55 each having a shape obtained by bisecting the plating hole 44 are formed on respective butting sides 53 of a plate material 52B having a predetermined shape in advance by a cut-out portion 54B indicated by hatching in (a) of FIG. 12. As a result, when the butting sides 53 on both sides come into contact with each other, one plating hole 44 is formed by two notches 55 as shown in (f) FIG. 12.

Second Modification

Figure 13:
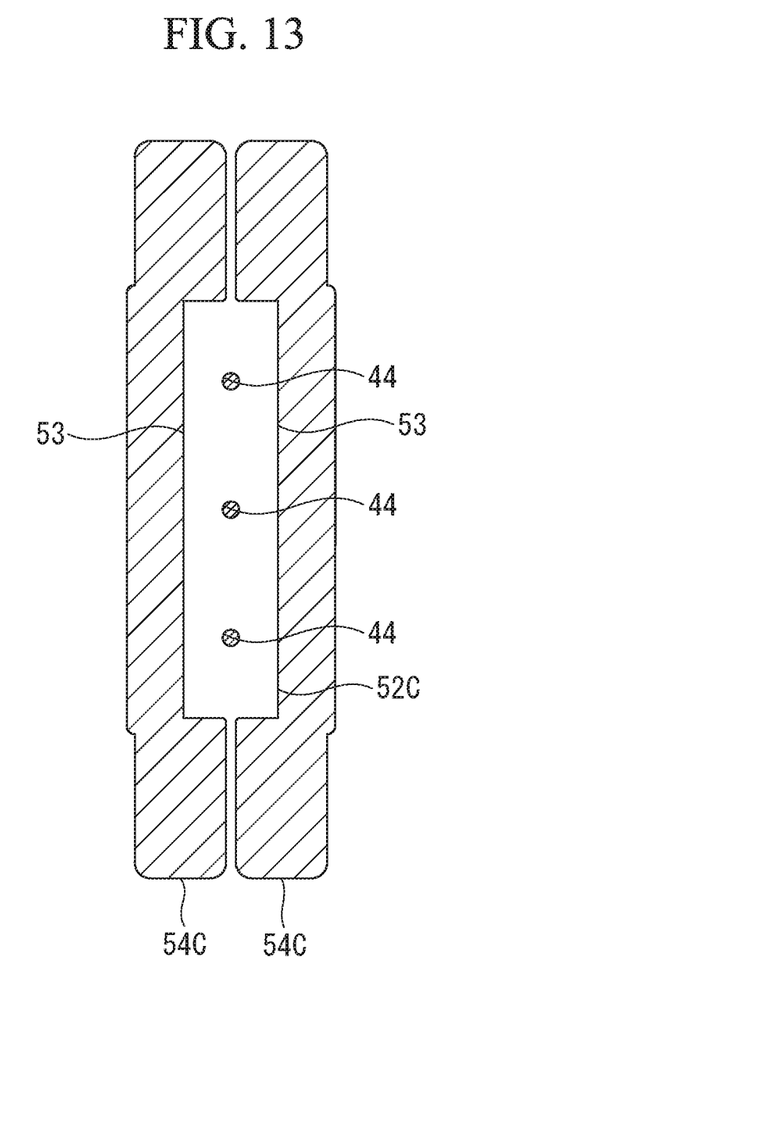
FIG. 13 is a diagram showing a plate material having a predetermined shape according to a second modification.

As shown in FIG. 13, a method of cutting out cut-out portions 54C from the plate material 50 to form a plate material 52C having a predetermined shape in which the plating holes 44 are formed in advance may be used in addition to a method of forming the notch 55 in each the butting side 53 as in the case of the first modification. The thus-formed plate material 52C having a predetermined shape is processed into a cylindrical shape by press working, thereby obtaining the base material 40 having the plating holes 44 formed therein.

Third Modification

Figure 14:
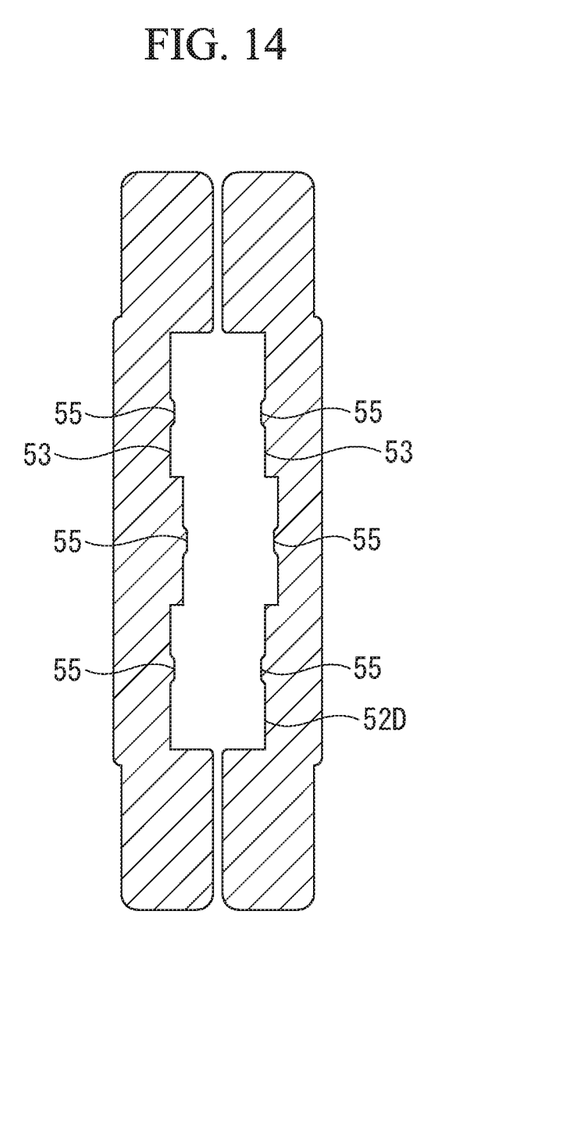
FIG. 14 is a diagram showing a plate material having a predetermined shape according to a third modification.

As shown in FIG. 14, a plate material 52D having a predetermined shape may be formed so that the butting sides 53 having the notches 55 formed therein are partially cranked. In FIG. 14, parts of the butting sides 53 having the notches 55 at the center are displaced from the other parts of the butting sides 53 having the other notches 55.

Figure 15:
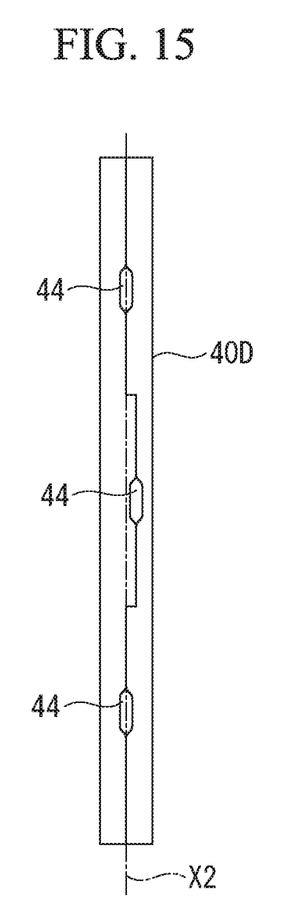
FIG. 15 is a diagram showing a base material according to the third modification.

As a result, as shown in FIG. 15, there is formed a base material 40D in which three plating holes 44 are formed in the direction of the central axial line X2, and the plating hole 44 which is located at the center in plan view is deviated from the central axial line X2 with respect to the other plating holes 44. At this time, the cranked butting sides 53 engage with each other in the direction of the central axial line X2, so that the strength of the base material 40D in the direction of the central axial line X2 is enhanced.

REFERENCE SIGNS LIST 1 socket (semiconductor inspection socket)
1a socket body
1b probe array board
3 board
5 IC package (inspection target device)
7 fixing bolt
9 device accommodating portion
30 contact probe
32 barrel (cylindrical member)
34 upper plunger
36 lower plunger
38 coil spring
40, 40B, 40D base material
41 first coating layer
42 second coating layer
44 plating hole (through-hole)
50 plate material
52, 52B, 52C, 52D plate material having a predetermined shape
53 butting side
54, 54B, 54C cut-out portion
55 notch
60 test piece
62 test stand

The invention claimed is:

1. A cylindrical member for use in a contact probe, comprising:
  a cylindrical base material including a portion at which opposing sides of a plate material made of beryllium copper are butted against each other, the portion extending along an axial line direction;
  an inner first coating layer and an outer first coating layer that are respectively formed on an inner surface and an outer surface of the base material and made of a Ni-based material and serve as a reinforcing material for the base material; and
  an inner second coating layer and an outer second coating layer that are respectively formed on the inner and outer first coating layers and made of a metal-based material different from the base material,
  wherein the first coating layer itself has higher hardness than the base material itself, and when a thickness of the cylindrical base material is represented by $T_B$ and a layer thickness of the first coating layer formed on the outer surface is represented by $T1_{OUT}$, the base material is formed so as to satisfy 13 μm≤$T_B$≤25 μm, and the first coating layer is formed so as to satisfy $T1_{OUT} \geq T_B \times 4\%$.

2. The cylindrical member according to claim 1, wherein the base material is formed so as to satisfy 15 μm≤$T_B$≤25 μm.

3. The cylindrical member according to claim 1, wherein when a layer thickness of the inner second coating layer is represented by $T2_{IN}$, the inner second coating layer is formed so as to satisfy $T2_{IN} \geq 0.05$ μm.

4. The cylindrical member according to claim 1, wherein the inner and outer first coating layers and/or the inner and outer second coating layers, are applied by a plating treatment.

5. The cylindrical member according to claim 1, wherein the base material is provided with a through-hole.

6. The cylindrical member according to claim 5, wherein the opposing sides are provided with notches which form the through-hole by butting the opposing sides against each other.

7. A contact probe comprising the cylindrical member according to claim 1.

8. A semiconductor inspection socket comprising the contact probe according to claim 7.

* * * * *